United States Patent [19]

Maeda

[11] Patent Number: 4,642,878

[45] Date of Patent: Feb. 17, 1987

[54] METHOD OF MAKING MOS DEVICE BY SEQUENTIALLY DEPOSITING AN OXIDIZABLE LAYER AND A MASKING SECOND LAYER OVER GATED DEVICE REGIONS

[75] Inventor: Satoshi Maeda, Yokohama, Japan

[73] Assignee: Kabushiki Kaisha Toshiba, Kawasaki, Japan

[21] Appl. No.: 770,179

[22] Filed: Aug. 28, 1985

[30] Foreign Application Priority Data

Aug. 28, 1984 [JP] Japan ................................ 59-178651
Aug. 28, 1984 [JP] Japan ................................ 59-178652

[51] Int. Cl.$^4$ ..................... H01L 21/265; H01L 21/26
[52] U.S. Cl. ......................... 29/571; 29/576 B; 29/578; 148/1.5; 148/187; 148/DIG. 82; 357/42; 357/91
[58] Field of Search ............... 29/571, 576 B, 578; 148/1.5, 187; 357/42, 91

[56] References Cited

U.S. PATENT DOCUMENTS

| | | | |
|---|---|---|---|
| 4,356,623 | 11/1982 | Hunter | 29/571 |
| 4,366,613 | 1/1983 | Ogura et al. | 29/571 |
| 4,442,591 | 4/1984 | Haken | 29/571 |
| 4,524,508 | 6/1985 | Sato | 29/571 |
| 4,527,325 | 7/1985 | Geipel, Jr. et al. | 29/571 |
| 4,535,528 | 8/1985 | Chen et al. | 29/571 |
| 4,536,944 | 8/1985 | Bracco et al. | 29/571 |
| 4,554,726 | 11/1985 | Hillenius et al. | 29/571 |
| 4,555,842 | 12/1985 | Levinstein et al. | 29/571 |
| 4,561,170 | 12/1985 | Doering et al. | 29/571 |
| 4,566,175 | 1/1986 | Smayling et al. | 29/576 B |

*Primary Examiner*—Upendra Roy
*Attorney, Agent, or Firm*—Finnegan, Henderson, Farabow, Garrett & Dunner

[57] ABSTRACT

A method for manufacturing a semiconductor device is disclosed which comprises the steps of forming an element isolating region of a first conductivity type, forming an insulating film on the surface of the element region which is isolated by the element isolating region, selectively forming a gate electrode on the insulating film, doping an impurity of a second conductivity type into the element region as a first doping step with the gate electrode and element isolating region as masks; sequentially forming a oxidizable first film and a second film on the whole surface of the resultant structure, anisotropically etching the second film to partly leave the second film area on that portion of the oxidizable first film which is located on the side wall of the gate electrode, doping an impurity of a second conductivity type with the remaining second film, gate electrode and element isolating region as masks, removing the remaining second film, and converting the oxidizable first film to an oxide film.

8 Claims, 28 Drawing Figures

METHOD OF MAKING MOS DEVICE BY SEQUENTIALLY DEPOSITING AN OXIDIZABLE LAYER AND A MASKING SECOND LAYER OVER GATED DEVICE REGIONS

BACKGROUND OF THE INVENTION

I. Field of the Invention:

This invention relates to a method for manufacturing a semiconductor device and, in particular, a method for manufacturing a semiconductor device, which includes an improved step of forming source and drain regions.

II. Description of the Prior Art:

In the manufacture of a MOS type semiconductor device, the microminiaturization technique has quickly been implemented, as known, whereby elements are microminiaturized with a high performance and integration density. In actual practice, a MOS type semiconductor device having a channel length of, for example, 1 μm or less has been developed. In the microminiaturized MOS type semiconductor device, a very high electric field is involved between the source and drain regions, in particular, between the source and drain regions in an n-channel MOS transistor, presenting various problems due to holes and electrons produced under a high electric field. As one example, a threshold voltage varies (rises) due to the electrons injected into a gate oxide film or a substrate current is abnormally increased due to the holes injected into the semiconductor substrate. This problem also arises in a complementary MOS semiconductor device (hereinafter referred to as a CMOS).

A method for manufacturing a MOS type semiconductor device, for example, an n-channel MOS IC has been proposed in which a high electric field between the source and drain regions is alleviated. The manufacturing method will be explained below by referring to FIGS. 1A to 1E.

First, a field oxide film 2 is formed, as an element isolating region, on the surface of a p type silicon substrate 1 of a crystal orientation (100) and an oxide film is formed on the substrate 1 at an island-like element area isolated by the field oxide film 2. Then, a phosphorus-doped polycrystalline silicon film is deposited on the whole surface of the resultant structure. The polycrystalline silicon film is patterned to form a gate electrode 3 on the oxide film overlying the respective element area. The oxide film is selectively etched with the gate electrode 3 as a mask to form a gate oxide film 4. With the gate electrode 3 and field oxide film 2 as masks, an n type impurity, such as phosphorus, is ion implanted at an acceleration voltage of 20 KeV and a dose of $1 \times 10^{13}$ cm$^{-2}$ into the resultant structure to form a layer of a lower concentration level of phosphorus. After the resultant structure has been heat-treated, an n type diffusion layer (5a, 5b) is formed at the element area of the substrate 1 as shown in FIG. 1A.

Then, a CVD-SiO$_2$ film 6 of, for example, 4,000 Å is deposited on the whole surface of the substrate, as shown in FIG. 1B. The CVD-SiO$_2$ film 6 is etched by an RIE (Reactive Ion Etching) method down to an extent corresponding to about the thickness of the CVD-SiO$_2$ film 6, leaving an SiO$_2$ wall 7 on the side surface of the gate electrode 3 and the gate oxide film 4, as shown in FIG. 1C. With the gate electrode 3, wall 7 and field oxide film 2 as masks, an n type impurity, such as arsenic, is ion implanted at an acceleration voltage of 40 KeV and a dose of $3 \times 10^{15}$ cm$^{-2}$. The resultant structure is heat-treated in an nitrogen atmosphere at 900° C. to permit the activation of arsenic. In this way, an n+type diffusion layer (8a, 8b) of a high concentration level is formed. As a result, as shown in FIG. 1D, a source region 9 comprised of an n−type diffusion layer 5a and n+type diffusion layer 8a is formed and a drain region 10 comprised of the n−type diffusion layer 5b and n+type diffusion layer 8a is formed at the surface of the resultant structure.

Then, an SiO$_2$ film 11 is deposited on the surface of the resultant structure and contact holes (12) are formed. An Al film is evaporated on the SiO$_2$ film 11, followed by a patterning step. As a result, an Al interconnection layer 13 is connected through the contact hole 12 to the n type source region 9 and an Al interconnection layer 14 is connected through the contact hole 12 to the drain region 10. In this way, an n-channel MOS IC is formed as shown in FIG. 1E.

According to the above-mentioned conventional method, a source region 9 is comprised of the n−type diffusion layer 5a of a low concentration level located in proximity to the gate electrode 3 and the n+type diffusion layer 8a of a high concentration level located remote from the gate electrode 3 and is formed at the element of the p type silicon substrate; and a drain region 10 is comprised of the n−type diffusion layer of a low concentration level located in proximity to the gate electrode 3 and the n+type diffusion layer 8b of a high concentration level located remote from the gate electrode 3 and is formed at the element area of the p type silicon substrate. In this way, the so-called LDD structure is implemented, whereby it is possible to suppress the generation of a high electric field between the above-mentioned source and drain regions.

However, the above-mentioned conventional method poses the following problems:

(1) In the step as shown in FIG. 1D, the CVD-SiO$_2$ film 6 is etched, by the RIE method, down to an extent corresponding to the thickness thereto, leaving the wall 7 on the side surfaces of the gate electrode 3. In this step, however, the thinning of the field oxide film 2 occurs due to the overetching of the field oxide film 2. As shown in FIG. 2, the field oxide film 2 for isolating one MOS transistor from another is narrowed so that a distance L between the n+layers 8 and 8 before the step of the RIE may be reduced to a distance Le to cause a lowered breakdown voltage.

(2) Since the wall 7 is formed by the RIE method, damage by ions is liable to occur at those surface portions of the silicon substrate where the source and drain regions are formed, prominently lowering the element characteristic.

(3) When the oxide film is selectively etched with the gate electrode 3 as the mask to form the gate oxide film 4, "undercutting" occurs on the gate oxide film, lowering the breakdown voltage between the gate electrode and the source and drain regions and thus deteriorating reliability.

A CMOS manufacturing method similar to the method shown in FIGS. 1A to 1E has also been proposed. This method will be explained below by referring to FIGS. 3A to 3G.

First, a p type semiconductor layer (p-well) 22 is selectively formed in an n type silicon substrate 1 of a crystal orientation (100). A field oxide film 23 is formed, as an element isolation region, at the substrate 21 and p-well 22, leaving island-like regions there. An oxide film is formed on the island-like regions of the substrate 21 and p-well 22 which are isolated by the field oxide film 23. Then, a phosphorus-doped polycrystalline silicon film is deposited on the surface of the resultant structure. The polycrystalline silicon film is patterned to form a gate electrode (24, 25) on the oxide film overlying the element region and, with the gate electrode (24, 25) as a mask, the oxide film is selectively etched, leaving the gate oxide film (26, 27) as shown in FIG. 3A.

Then, a resist pattern 28 is formed by a photolithography on that surface of the n type element region, and with the resist pattern 28, gate electrode 24 and field oxide film 23 as masks an n type impurity, such as phosphorus, is ion implanted into the p-well 22 at an acceleration voltage of 20 KeV and a dose of $1 \times 10^{13}$ cm$^{-2}$ to form a phosphorus ion injected layer (29a, 29b) of a low concentration level, as shown in FIG. 3B. After the removal of the resist pattern 28, a resist pattern 30 is so formed by the photolithography as to cover the p-well 22. With the resist pattern 30, gate electrode 25 and field oxide film 23 as masks, a p type impurity, such as boron, is ion implanted into the n type substrate 21 at an acceleration voltage of 40 KeV and a dose of $1 \times 10^{15}$ cm$^{-2}$ to form a boron ion injected layer (31a, 31b) as shown in FIG. 3C.

After the removal of the resist pattern 30, a CVD-SiO$_2$ film 32 of, for example, 4,000 Å is deposited on the surface of the resultant structure, followed by a heat treatment for 30 minutes in a nitrogen atmosphere at, for example, 900° C. As shown in FIG. 3D, the phosphorus ion injected layer (29a, 29b) is activated to form an n$^-$type diffusion layer (33a, 33b) of a low concentration level, while, on the other hand, the boron ion injected layer (31a, 31b) is activated to form p$^+$type source and drain regions (34, 35). The CVD-SiO$_2$ film 32 is etched, by the RIE method, down to an extent corresponding to about the thickness thereof, leaving a wall 36 on the side surfaces of the gate electrode 24 and gate oxide film 26 and on the side surfaces of the gate electrode 25 and gate oxide film 27 as shown in FIG. 3E.

Then, a resist pattern, not shown, is so formed by the photolithography as to cover the element area in the n type substrate 21. With the resist pattern, gate electrode 24, wall 36 and field oxide film 23 as masks, an n type impurity, such as arsenic, is ion implanted into the element area in the p-well at an acceleration voltage of 40 KeV and a dose of $3 \times 10^{15}$ cm$^{-2}$. After the removal of the resist pattern, heat treatment is performed in an nitrogen atmosphere at, for example, 900° C. As a result, the arsenic ion injected layer is activated to form n$^+$type diffusion layers (37a, 37b). As a result, a source region 38 is formed, comprising the n$^-$type diffusion layer 33a and n$^+$type diffusion layer 37a. A drawn region 39 is also formed which comprises the n$^-$type diffusion layer 33b and n$^+$type diffusion layer 37b. An SiO$_2$ film 40 is deposited on the whole surface of the resultant structure and an opening is formed as a contact hole (41, 41b, 41c, 41d). An Al film is evaporated on the SiO$_2$ film 40, followed by a patterning step. An Al interconnection layer 42 is connected through a contact hole 41a to the n type source region 38, an Al interconnection layer 43 is connected respectively through contact holes 41c and 41b to the drain regions 35 and 39, and an Al interconnection layer 44 is connected through the contact hole 41d to the p$^+$type source region 34. In this way, a CMOS device is manufactured as shown in FIG. 3G.

According to the conventional method, an n-channel transistor so formed is of the so-called LDD type in which the source region comprises the n$^-$type diffusion layer 33a of a low conductivity level located in proximity to the gate electrode 24 and the n$^+$type diffusion layer 37a of a high concentration level located remote from the gate electrode 24 and the drain region 39 comprises the n$^-$type diffusion layer 33b of a low concentration level located in proximity to the gate electrode 24 and the n$^+$type diffusion layer 37 of a high concentration level located remote from the gate electrode 24. It is therefore possible to suppress the generation of a high electric field between the above-mentioned source and drain regions.

The method as explained in connection with FIGS. 3A to 3G presents the same problems as those as set out in connection with FIGS. 1A to 1E. Furthermore, the following problems arise therefrom. According to the method, in order to avoid a possible "offsetting" of the source and drain regions 34 and 35 of the p-channel transistor, the source and drain regions 34 and 35 are formed before the walls 36 are formed on the side surfaces of the gate electrode (24, 25). Even after the p$^+$type source and drain regions 34 and 35 are formed, the resultant structure is subjected to a heat treatment at a high temperature for the formation of the n$^+$type diffusion layers 37a and 37b, causing a redistribution of an impurity to occur at the source and drain regions with a deeper junction. As a result, the p-channel transistor reveals a marked "short channel effect", leading to a variation etc. of the threshold voltage. In order to prevent a possible redistribution of the impurity from occurring at the p$^+$type source and drain regions 34 and 35, one method is to form p$^+$type source and drain regions through the ion implantation of a p type impurity after the CVD-SiO$_2$ wall 36 has been removed. In this method, however, the field oxide film 23 is etched during the removal of the CVD-SiO$_2$, causing the thinning of the film as has been explained in connection with the problem (1) above.

SUMMARY OF THE INVENTION

It is accordingly the object of this invention to provide an LDD (lightly doped drain) type semiconductor device with high performance and reliability which prevents a decrease in the breakdown voltage of an element isolating region and a decrease in the breakdown voltage between a gate electrode and source and drain regions and prevents any possible damage to the surface of the semiconductor substrate due to the action of ions, from occurring.

According to a first aspect of this invention, a method for manufacturing a semiconductor device is provided which comprises the steps of forming an element isolating region on the surface of a semiconductor substrate of a first conductivity type; forming an insulating film on the surface of the element region of the semiconductor substrate which is isolated by the element isolating region; selectively forming a gate electrode on the insulating film; doping an impurity of a second conductivity type as a first doping step into the element region with the gate electrode and element isolating region as masks; sequentially forming an oxidizable first film and a second film on the whole surface of the resultant structure; anisotropically etching the second film to leave the second film on that portion of the oxidizable first film which corresponds to the side wall of the gate electrode; doping an impurity of a second conductivity type as a second doping step into the element region with the remaining second film, gate electrode and element isolating region as masks, the impurity of the second conductivity type higher in a concentration level than that of the second conductivity type in the first doping step; removing the remaining second film; and converting the oxidizable first film to an oxide film.

According to a second aspect of this invention, a method for manufacturing a complementary semiconductor device is provided which comprises the steps of forming a well of a second conductivity type in a semiconductor substrate of a first conductivity type; forming an element isolating region in the semiconductor substrate and well and thus forming a first element region in the well and a second element region in the semiconductor substrate; forming insulating films on the surfaces of the first and second element regions; selectively forming a first gate electrode on the insulating film overlying the first element region and a second gate electrode on the insulating film overlying the second element region; doping an impurity of the first conductivity type as a first doping step in the first and second element regions with the first and second gate electrodes and element isolating region as masks; sequentially forming an oxidizable first film and a second film on the surface of the resultant structure; anisotropically etching the second film to leave the second film on those portions of the oxidizable first film which correspond to the side walls of the first and second gate electrodes; doping an impurity of the first conductivity type as a second doping step in the first element region with the left second film, first gate electrode and element isolating region as masks; removing the left first film; converting the oxidizable first film to an oxide film; and doping, subsequent to either the removing or converting step, an impurity of the second conductivity type as a third doping step in the second isolating region with the second gate electrode and element isolating region as masks.

In the first and second aspects of this invention, the oxidizable first film can be formed of a polycrystalline silicon, amorphous silicon or metal silicide. As a metal silicide use may be made of molybdenum silicide, tungsten, etc. As the second film, use can be made of, for example, a CVD-SiO$_2$ film, phosphosilicate glass film, silicon nitride film or resist film.

According to the first aspect of this invention, a high-performance and highly reliable semiconductor device of an LDD (lightly doped drain) structure can be implemented which can prevent a drop in the breakdown voltage on the element isolating region as well as a drop in the breakdown voltage across the gate electrode and the source and drain regions and can prevent damage, due to the action of ions on the surface of the semiconductor substrate, from occurring.

According to the second aspect of this invention, a complementary semiconductor device can be implemented which can obtain the above-mentioned advantages as having explained in connection with the first aspect of this invention and can prevent a variation or a drop in the threshold voltage of the transistor in the well.

DETAILED DESCRIPTION OF THE PREFERRED EMBODIMENTS

Examples of this invention will now be explained below with respect to the accompanying drawings.

Example 1 is directed to a method for manufacturing an n-channel MOS IC according to this invention and Example 2 is directed to a method for manufacturing a CMOS.

EXAMPLE 1

Example 1 will be explained below by reference to FIGS. 4A to 4G.

Figure 1A:
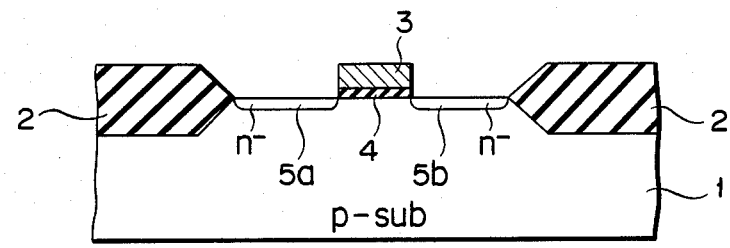
FIGS. 1A to 1E are cross-sectional views showing the steps of manufacturing a conventional MOS IC.
Figure 1B:
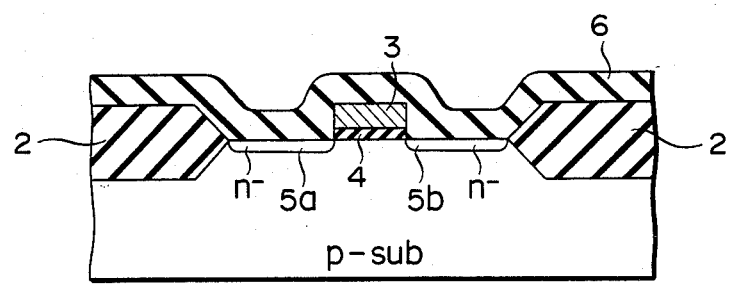
Figure 1C:
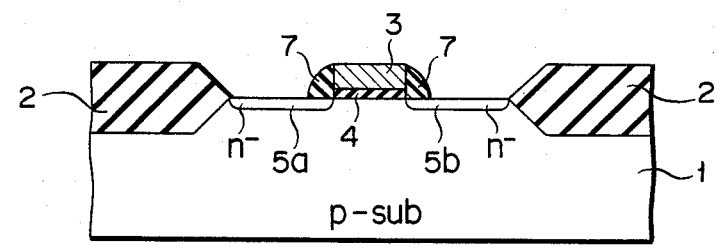
Figure 1D:
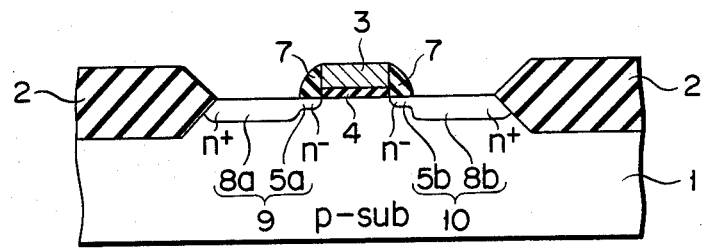
Figure 1E:
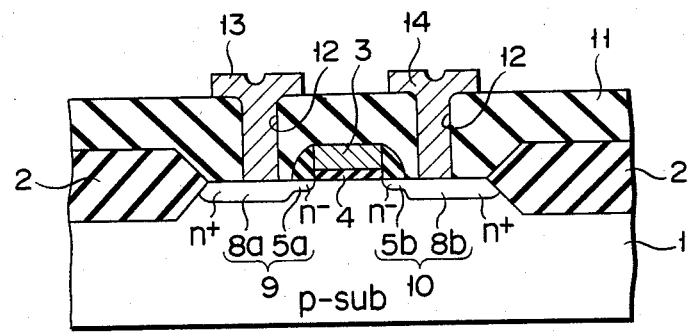
Figure 2:
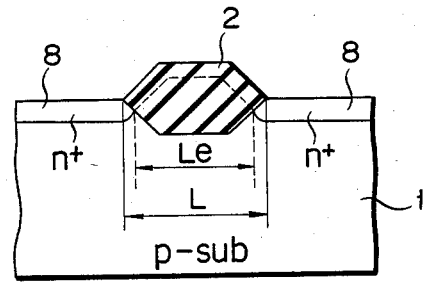
FIG. 2 is a cross-sectional view for explaining a problem encountered during the manufacture of the MOS IC of FIG. 1.
Figure 3A:
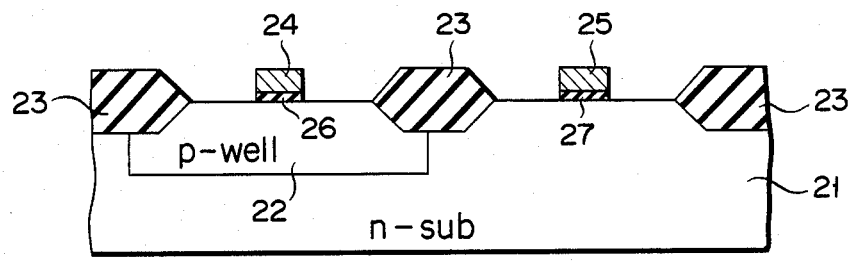
FIGS. 3A to 3G are cross-sectional views showing the steps of manufacturing a conventional CMOS device.
Figure 3B:
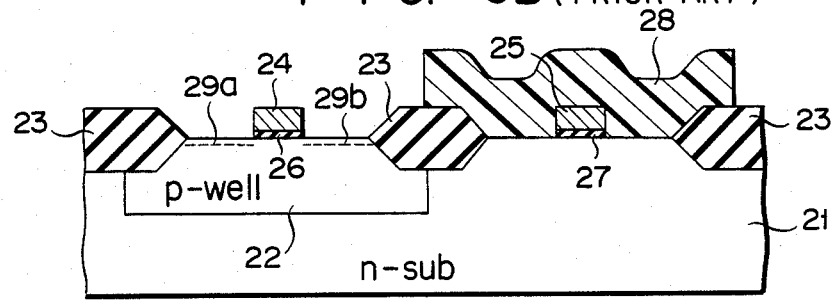
Figure 3C:
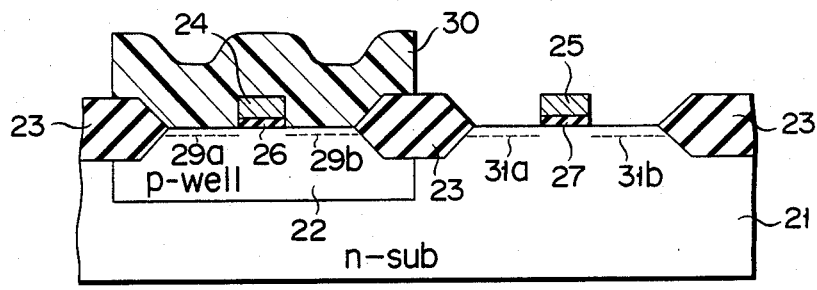
Figure 3D:
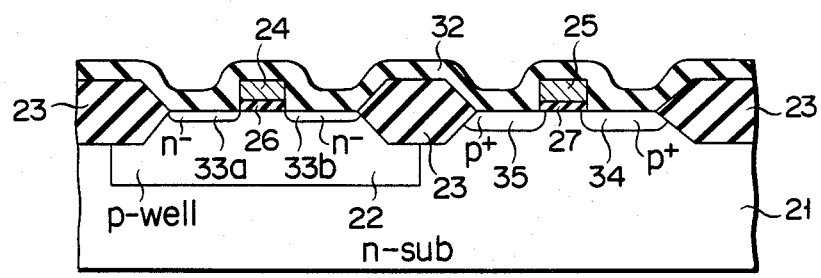
Figure 3E:
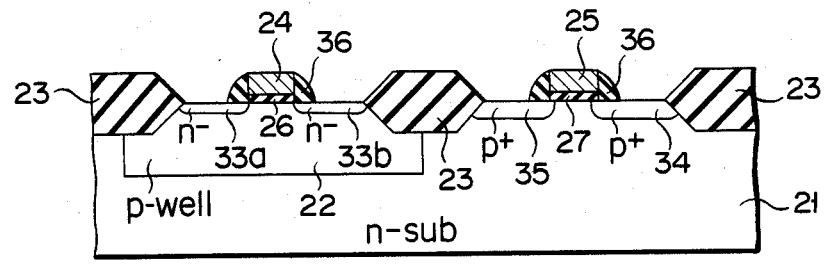
Figure 3F:
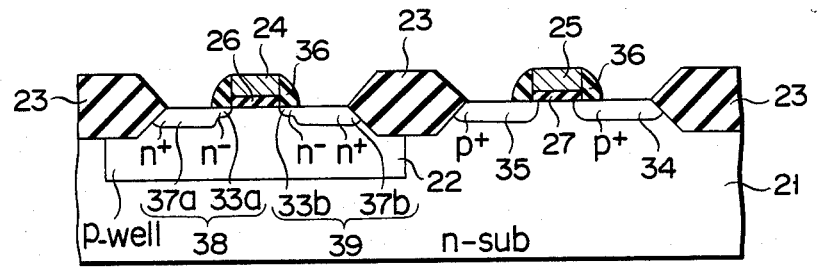
Figure 3G:
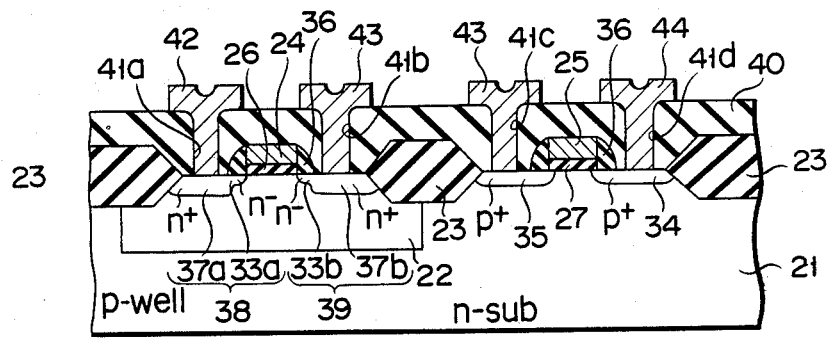
Figure 4A:
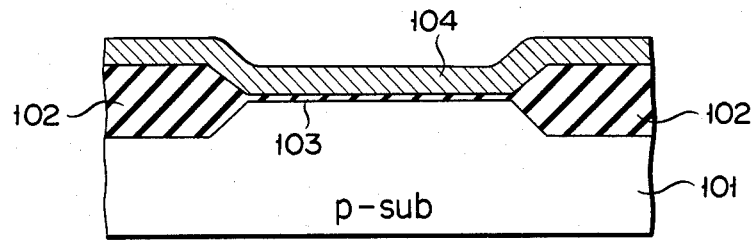
FIGS. 4A to 4G are cross-sectional views showing the steps of manufacturing an MOS IC according to Example 1 of this invention.

First, a field oxide film 102 was formed, as an element isolating area, on an n type silicon substrate 101 of a crystal orientation (100) by virtue of, for example, a selective oxidation method. An oxide film 103 was formed on the substrate 101 at an island-like element region isolated by the field oxide film 102, and a phosphorus-doped polycrystalline silicon film 104 was deposited, as shown in FIG. 4A, on the surface of the resultant structure.

Figure 4B:
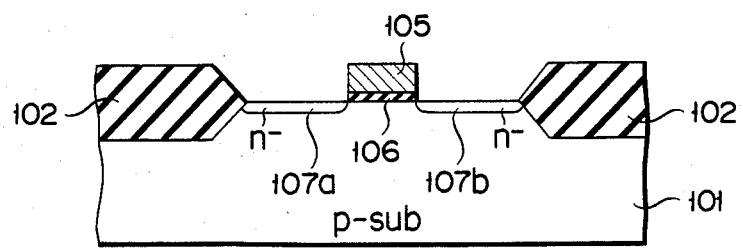

Then, the polycrystalline silicon film 104 was patterned to form a gate electrode 105 on the oxide film on the element region. With the gate electrode 105 as a mask the oxide film 103 was selectively etched, leaving the gate oxide film 106. With the gate electrode 105 and field oxide film 102 as masks, an n-type impurity, such as phosphorus, was ion implanted into the resultant structure with an acceleration voltage of 20 KeV and a dose of $1 \times 10^{13}$ cm$^{-2}$. After a heat treatment step was performed, the ion implanted layer was activated to form n$^-$type diffusion layers 107a and 107b as shown in FIG. 4B.

Figure 4C:
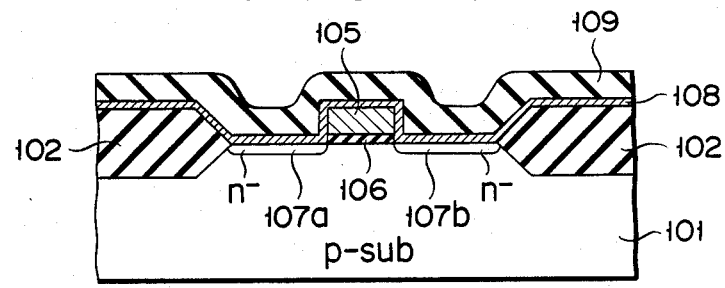
Figure 4D:
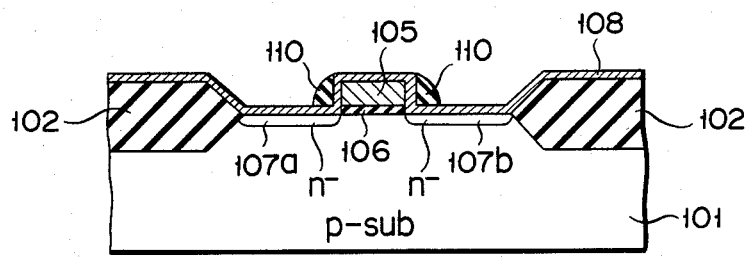

Then, a polycrystalline silicon film 108 of, for example, 300 Å in thickness and a CVD-SiO$_2$ film 109 of, for example, 4,000 Å were sequentially deposited on the surface of the resultant structure as shown in FIG. 4C. The CVD-SiO$_2$ film 109 was etched by the RIE method down to an extent corresponding to the thickness thereof, leaving a wall 110 on the side surface of the gate electrode 105 and gate oxide film 106 as shown in FIG. 4D.

Figure 4E:
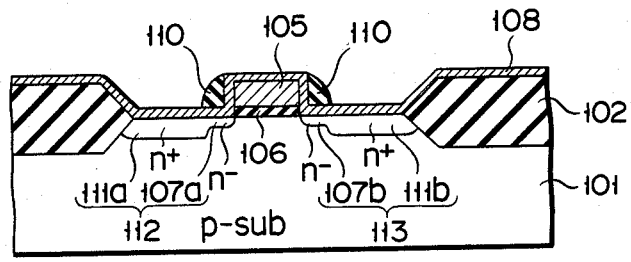

Then, with the gate electrode 105, wall 110 and field oxide film as masks, an n type impurity, such as arsenic, was ion implanted into the element area with an acceleration voltage of 80 KeV and a dose of $3 \times 10^{15}$ cm$^{-2}$. The resultant structure was heat treated in a nitrogen atmosphere at 900° C. to permit the element area to be activated to form n$^+$type diffusion layers 111a and 111b. In this way, as shown in FIG. 4E, a source region 112 was formed which comprises the n$^-$type diffusion layer 107a and n$^+$type diffusion layer 111a, and at the same time a drain region 113 was formed which comprises the n$^-$type diffusion layer 107b and n$^+$type diffusion layer 111b.

Figure 4F:
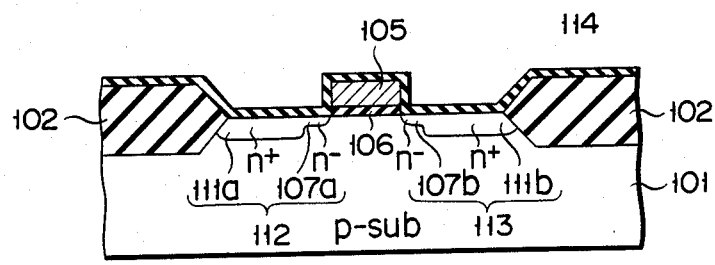
Figure 4G:
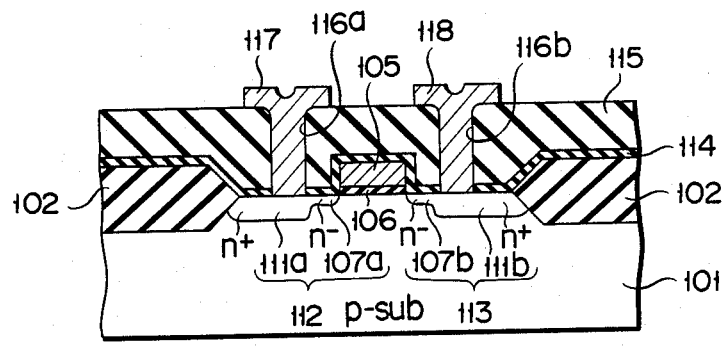

After the wall 110 was removed as shown in FIG. 4F, the polycrystalline silicon film 108 was converted to an oxide film 114 through a thermal oxidation process. Then, the SiO$_2$ film 115 was deposited on the whole surface of the resultant structure and an opening is formed, as a contact hole (116a, 116b), in the SiO$_2$ film 115. An Al film was evaporated on the surface of the SiO$_2$ film 115 and patterned to form an Al interconnection layer 117 connected through the contact hole 116a to the n type source region 112 and an Al interconnection layer 118 connected through the contact hole 116b to the drain region 113. In this way, an n-channel MOS IC was manufactured as shown in FIG. 4G.

In Example 1, the source region 112 and drain region 113 were formed in the element region of the p type silicon substrate, the source region 112 being comprised of the n$^-$type diffusion layer 107a of a low concentration level located in proximity to the gate electrode 105 and the n$^+$type diffusion layer 111a distant from the electrode 105 and the drain region 113 being comprised of the n$^-$type diffusion layer 107b of a lower concentration level located in proximity to the gate electrode 105 and the n$^+$type diffusion layer 111b of a high concentration level located distant from the gate electrode 105. This MOS IC is of the so-called LDD type so that it is possible to prevent a high electric field from being generated between the above-mentioned source and drain regions.

Where the CVD-SiO$_2$ film 109 is etched by the RIE method so as to leave the CVD-SiO$_2$ film 109 on the side surface of the gate electrode 105, the polycrystalline silicon film 108 is formed below the CVD-SiO$_2$ film 109. The polycrystalline silicon film 108 functions as an etching stopper, thereby preventing the thinning of the field oxide film as well as preventing any possible damage from occurring on the surface of the substrate 101, due to the action of ions by the RIE method. It is therefore possible to obtain an n-channel MOS IC of high reliability.

Although "undercutting" may be produced when the oxide film 103 is etched with the gate electrode 105 as a mask, it is filled with the oxide film 14 to which the polycrystalline silicon film 108 is thermally converted. As a result, it is possible to prevent the breakdown voltage from being lowered between the source and drain regions 112 and 113.

Although in the above-mentioned embodiment the polycrystalline silicon film is used as the oxidizable film, use may be made of an amorphous silicon film or a metal silicide film.

While, in the above-mentioned embodiment, the CVD-SiO$_2$ film has been used as a film to be formed on the oxidizable film, use may be made of a phosphosilicate glass (PSG) film, nitride film or resist film.

EXAMPLE 2

Example 2 will be explained below by referring to FIGS. 5A to 5H.

Figure 5A:
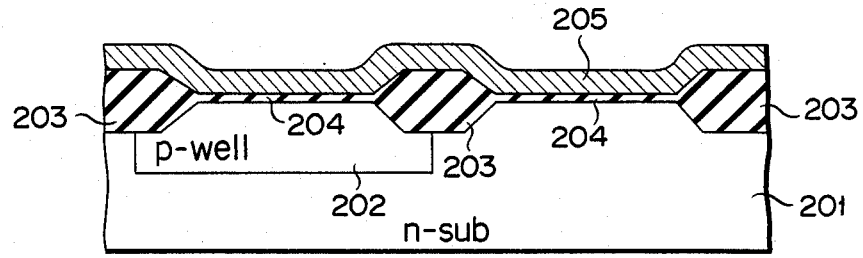
FIGS. 5A to 5H are cross-sectional views showing the steps of manufacturing a CMOS device according to Example 2 of this invention.

First, a p-well 202 was selectively formed by, for example, a thermal diffusion step in the surface of an n type silicon substrate 201 of a crystal orientation (100), and a field oxide film 203 was formed, as an element isolation region, on the substrate 201 and p-well 202 by virtue of, for example, a selective oxidation method. Then, an oxide film 204 was formed on those island-like element regions of the substrate 201 and p-well 202 which were isolated by the field oxide film 203. A phosphorus-doped polycrystalline silicon film 205 was deposited on the whole surface of the resultant structure, as shown in FIG. 5A.

Figure 5B:
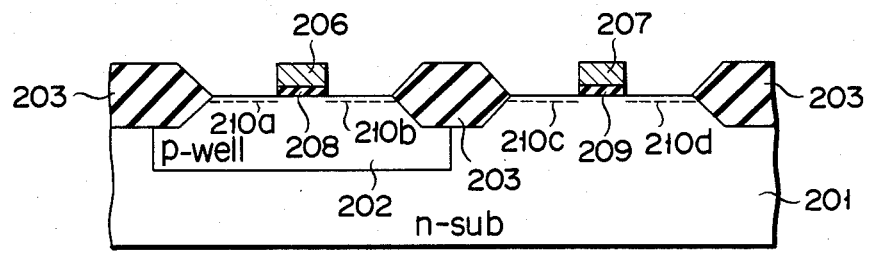
Figure 5C:
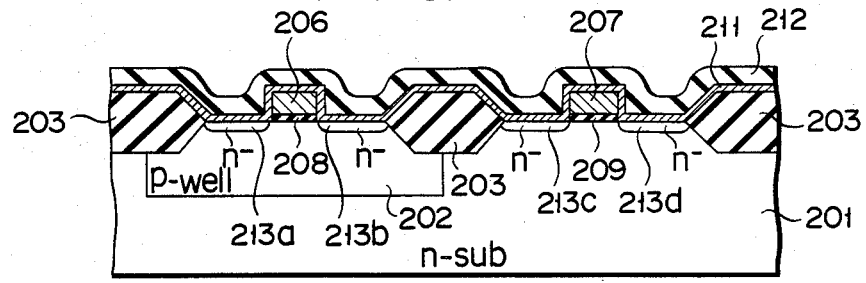

Then, the polycrystalline silicon film 205 was subjected to a patterning step, leaving a gate electrode (206, 207) on the oxide film 204 overlying the respective element region. With the respective gate electrode (206, 207) as a mask, the oxide film 204 was selectively etched, leaving a gate oxide film (208, 209). With the gate electrode (206, 207) and field oxide film 203 as the masks an n type impurity, such as phosphorus, was ion implanted into the element region at an acceleration voltage of 20 KeV and a dose of $1 \times 10^{13}$ cm$^{-2}$ to form phosphorus ion implanted layers 210a, 210b, 210c and 210d of a low concentration level as shown in FIGS. 5B.

Figure 5D:
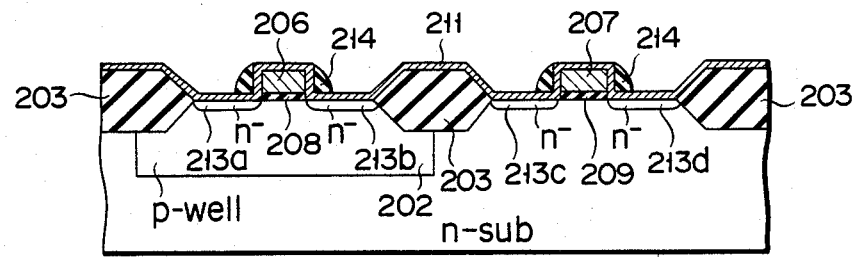

Then, a polycrystalline silicon film 211 of, for example, 300 Å in thickness and a CVD-SiO$_2$ film 212 of, for example, 4,000 Å in thickness were sequentially deposited on the surface of the resultant structure, followed by performing a heat treatment in a nitrogen atmosphere for 30 minutes at, for example, 900° C. By this heat treatment, the above-mentioned phosphorus ion implanted layer (210a to 210d) was activated to form n$^-$type diffusion layer (213a to 213d) of a low concentration level. The CVD-SiO$_2$ film 212 was etched by the RIE method down to an extent corresponding to about the thickness thereof, leaving a wall 214 on the side surfaces of the gate electrode 206 and gate oxide film 208 and on the side surfaces of the gate electrode 207 and gate oxide film 209 as shown in FIG. 5D.

Then, a resist pattern, not shown, was formed by the photolithography in a manner to cover that element area of the substrate 201 in which the p-well is not formed. With the resist pattern, gate electrode 206 (on the p-well 202), wall 214 and field oxide film 203 as masks, an n type impurity, such as arsenic, was ion-implanted into the element region in the p-well, with an acceleration voltage of 40 KeV and a dose of $3 \times 10^{15}$ cm$^{-2}$. After the resist pattern was removed, the resultant structure was heat treated in a nitrogen atmosphere at 900° C., causing the arsenic ion injected layer to be activated to provide n$^+$type diffusion layer (215a, 215b) of a high concentration level.

Figure 5E:
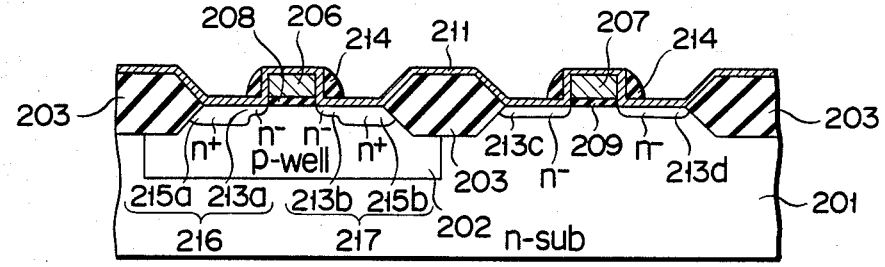
Figure 5F:
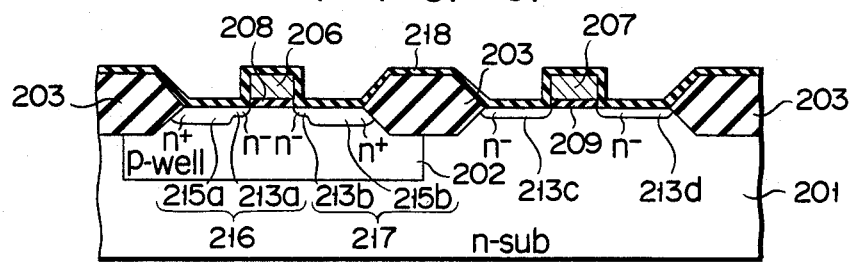
Figure 5G:
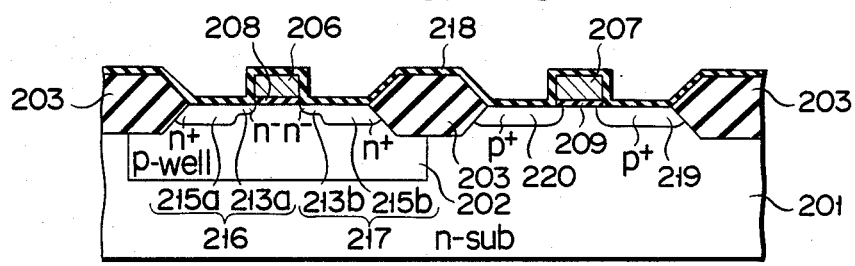

Then, after the wall 214 was removed as shown in FIG. 5F, the polycrystalline silicon film 211 was converted to the oxide film 218 through a thermal oxidation treatment. A resist pattern, not shown, was formed by the photoetching method to cover the p-well 202. With the resist pattern, gate electrode 207 and field oxide film 203 as masks, a p type impurity, such as boron, was ion implanted into n$^-$type diffusion layers 213c and 213d at an acceleration voltage of 40 KeV and a dose of $1 \times 10^{15}$ cm$^{-2}$. After a resist pattern was removed, a heat treatment was effected at, for example, 900° C., causing the boron ion implanted layer to be activated to provide p$^+$type source and drain regions 219 and 220 at the element region of the substrate 201 as shown in FIG. 5G.

Figure 5H:
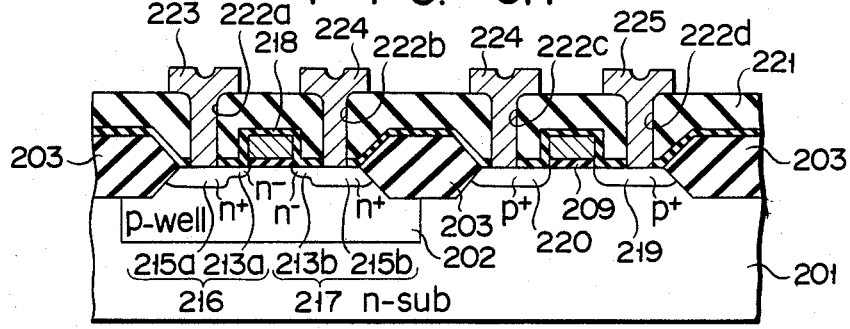

Then, the SiO$_2$ film 221 was deposited on the whole surface of the resultant structure and an opening was formed as a contact hole (222a, 222b, 222c, 222d). An Al film was evaporated on the SiO$_2$ film and subjected to a patterning step. As a result, an Al interconnection layer 223 was connected through the contact hole 222a to the n type source region 216, an Al interconnection layer 224 was connected respectively through the contact holes 222b and 222c to the drain regions 217 and 120, and an Al interconnection layer was connected through the contact hole 222d to the above-mentioned p+type source region 219. In this way, a CMOS was manufactured as shown in FIG. 5H.

According to Example 2, when the CVD-SiO$_2$ film 212 was etched by the RIE method to leave the CVD-SiO$_2$ walls on the side surfaces of the gate electrode (206, 207), the polycrystalline silicon film 211 was formed beneath the CVD-SiO$_2$ film. Since, in this case, the polycrystalline silicon film 211 functions as an etching stopper, it is possible to prevent the thinning of the field oxide film 203. It is also possible to prevent the surface of the substrate 201 and p-well 202 from being damaged due to the action of ions thereon by the RIE method.

"Undercutting" may occur at the gate oxide film (208, 209) when the oxide film 204 is etched with the gate electrodes 206 and 207 as masks. However, such "undercutting" is filled by the oxide film 218 to which the polycrystalline silicon film 211 has been converted through the thermal oxidation process. As a result, a drop in the breakdown voltage between the gate electrode (206, 207) and the source and drain regions (216, 217; 219, 220) can be reduced.

As shown in FIGS. 5E and 5F, since the polycrystalline silicon film 211 is coated over the field oxide film 203, upon the removal of the wall 214, it is possible to prevent the thinning of the field oxide film 203. As a result, it is possible to form the offset-free p+type source and drain regions 216 and 217 in the p-channel transistor after the wall 214 has been removed, i.e., after the high temperature heat treatment has been performed for forming the source and drain regions 216 and 217 of the n-channel transistor. It is therefore possible to prevent a threshold voltage variation from occurring due to a deeper junction resulting from rediffusion of impurities at the p+type source and drain regions 219 and 220. In consequence, a CMOS of high performance can be obtained according to this invention.

Although, in the above-mentioned embodiment, the polycrystalline silicon film has been used as the oxidizable film, use may be made of a amorphous silicon film or a metal silicide film instead.

Although, in the above-mentioned embodiment, the CVD-SiO$_2$ film has been used as the film to be formed on the oxidizable film, use may be made of a PSG film, nitride film or resist film.

Although, in the above-mentioned embodiment, the p type diffusion layer of a high concentration level has been formed after converting the polycrystalline silicon film to the oxide film, the p type diffusion layer of the high concentration level may be formed before such a conversion process.

What is claimed is:

1. A method for manufacturing a semiconductor device, comprising the steps of:
   forming an element isolating region on a semiconductor substrate of a first conductivity type;
   forming an insulating film at the surface of an element region of said semiconductor substrate isolated by said element isolating region;
   selectively forming a gate electrode having a side wall on said insulating film;
   doping an impurity of a second conductivity type in the element region as a first doping step with the gate electrode and element isolating region as masks;
   sequentially forming an oxidizable first film and a second film on the surface of the resultant structure;
   anisotropically etching the second film to leave partly said second film on that portion of oxidizable first film located on the side wall of the gate electrode;
   doping an impurity of a second conductivity type in said element region, as a second doping step, with the left second film, gate electrode and element isolating region as masks, said impurity of said second conductivity type being higher than that of said second conductivity type in said first doping step;
   removing said left second film; and
   converting said oxidizable first film to an oxide film.

2. A method according to claim 1, in which said oxidizable first film is one kind selected from the group consisting of a polycrystalline silicon film, an amorphous silicon film and a metal silicide film.

3. A method according to claim 1, in which said second film is one kind selected from the group consisting of a CVD-SiO$_2$ film, a phospho-silicide glass film, a silicon nitride film and a resist film.

4. A method according to claim 1, in which said anisotropic etching is a reactive ion etching.

5. A method of manufacturing a complementary semiconductor device comprising the steps of:
   forming a well of a second conductivity type in a semiconductor substrate of a first conductivity type;
   forming element isolating regions on said semiconductor substrate and said well and including forming a first element region in said well and a second element region in said semiconductor substrate;
   forming an insulating film on the surface of said first and second element regions;
   selectively forming a first gate electrode on said insulating film overlying said first element region and a second gate electrode on said insulating film overlying said second element region;
   doping an impurity of a first conductivity type into said first and second element regions, as a first doping step, with said first and second gate electrodes and said element isolating regions as masks;
   sequentially forming an oxidizable first film and a second film on the whole surface of the resultant structure;
   anisotropically etching said second film to partly leave said second film on that portion of said oxidizable first film which is located on the side wall of said first and second gate electrodes;
   doping an impurity of a first conductivity type into said first element region as a second doping step with said left second film, first gate electrode and element isolating region as masks;
   removing said left second film;
   converting said oxidizable first film to an oxide film; and
   doping, subsequent to either one of said removing step and said converting step, an impurity of said second conductivity type in said second isolating region as a third doping step with said second gate electrode and element isolating region as masks.

6. A method according to claim 5, in which said oxidizable first film is one kind selected from the group consisting of a polycrystalline silicon film, amorphous silicon film and metal silicide film.

7. A method according to claim 5, in which said second film is one kind selected from the group consisting of a CVD-SiO$_2$ film, phospho-silicide glass film, silicon nitride film and resist film.

8. A method according to claim 5, in which said anisotropic etching is a reactive ion etching.

* * * * *